United States Patent
Brox et al.

(10) Patent No.: US 7,336,552 B2
(45) Date of Patent: Feb. 26, 2008

(54) SENSE AMPLIFIER CONNECTING/DISCONNECTING CIRCUIT ARRANGEMENT AND METHOD FOR OPERATING SUCH A CIRCUIT ARRANGEMENT

(75) Inventors: Martin Brox, München (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/927,497

(22) Filed: Aug. 27, 2004

(65) Prior Publication Data

US 2005/0117435 A1    Jun. 2, 2005

(30) Foreign Application Priority Data

Aug. 29, 2003   (DE) ................................ 103 39 894

(51) Int. Cl.
*G11C 7/12* (2006.01)

(52) U.S. Cl. ...................... 365/204; 365/202; 365/203; 365/208; 365/207; 365/190; 365/72; 365/63; 365/51

(58) Field of Classification Search .............. 365/190, 365/205, 208, 207, 202, 203, 204, 189.11, 365/51, 63, 72
See application file for complete search history.

(56) References Cited

U.S. PATENT DOCUMENTS

| 5,334,890 | A | * | 8/1994 | Hardee | ......................... 327/51 |
| 5,396,465 | A | * | 3/1995 | Oh et al. | ..................... 365/201 |
| 5,793,664 | A | | 8/1998 | Nagata et al. | ................. 365/72 |
| 6,023,437 | A | * | 2/2000 | Lee | ............................. 365/203 |
| 6,097,652 | A | * | 8/2000 | Roh | ............................. 365/203 |
| 6,301,173 | B2 | * | 10/2001 | Fujioka et al. | .............. 365/203 |
| 6,661,714 | B2 | * | 12/2003 | Lee | ....................... 365/189.11 |
| 2001/0015928 | A1 | * | 8/2001 | Fujioka et al. | .............. 365/203 |
| 2003/0095466 | A1 | | 5/2003 | Uchida et al. | ......... 365/230.06 |

FOREIGN PATENT DOCUMENTS

DE   10238363 A1   3/2003

* cited by examiner

*Primary Examiner*—Andrew Q. Tran
(74) *Attorney, Agent, or Firm*—Slater & Matsil, L.L.P.

(57) ABSTRACT

An apparatus and method for operating a sense amplifier connecting/disconnecting circuit arrangement, in particular for a semiconductor memory device, including a switching device for connecting/disconnecting a sense amplifier to/from a bit line of a first cell field region, and for connecting/disconnecting the sense amplifier to/from from a bit line of a second cell field region, as a function of the state of control signals applied at control lines. Driver devices drive the control signal. Additional switches change the state of the control signals.

8 Claims, 3 Drawing Sheets

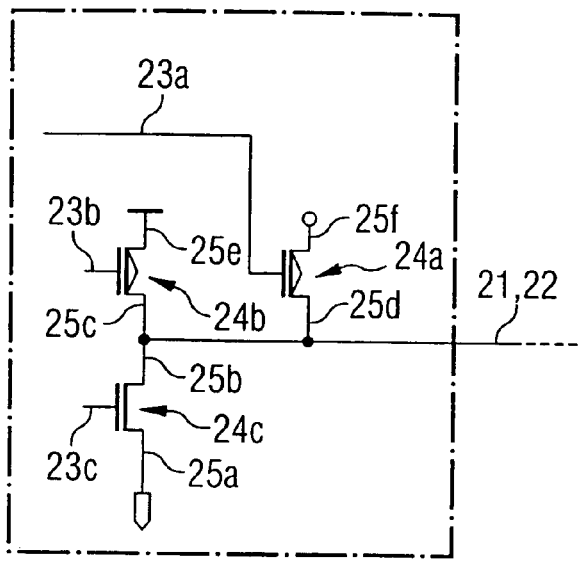
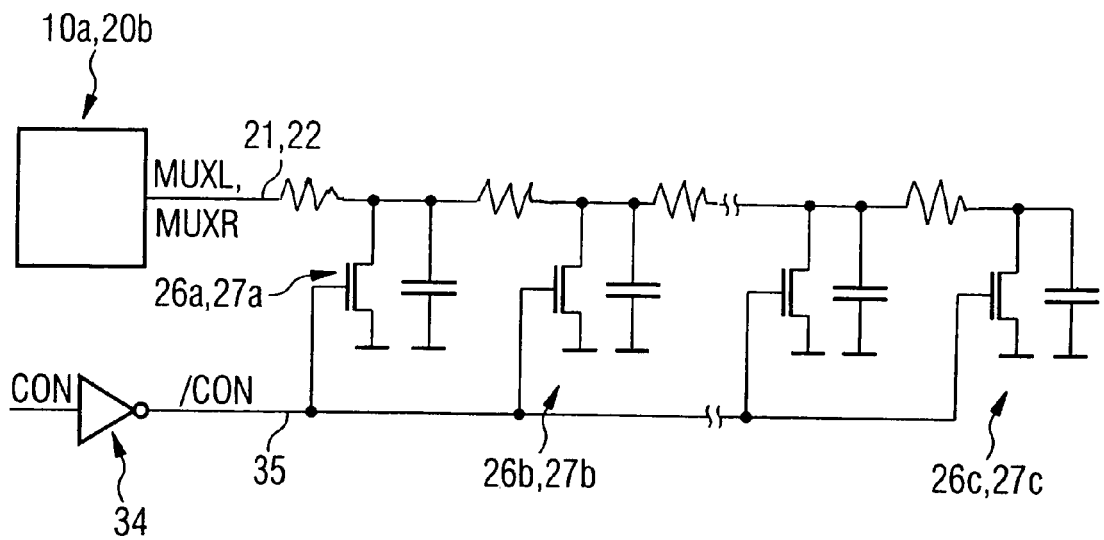

SENSE AMPLIFIER CONNECTING/DISCONNECTING CIRCUIT ARRANGEMENT AND METHOD FOR OPERATING SUCH A CIRCUIT ARRANGEMENT

CLAIM FOR PRIORITY

This application claims priority to German Application No. 103 39 894.5 filed on Aug. 29, 2003.

TECHNICAL FIELD OF THE INVENTION

The invention relates to a sense amplifier connecting/disconnecting circuit arrangement, and to a method for operating such a circuit arrangement.

BACKGROUND OF THE INVENTION

With semiconductor memory devices, one differentiates between so-called functional memory devices (e.g. PLAs, PALs, etc.), and so-called table memory devices, e.g. ROM devices (ROM=Read Only Memory), and RAM devices (RAM=Random Access Memory or write-read memory).

A RAM device is a memory for storing data under a predetermined address and for reading out the data under this address later.

The corresponding address may be input in the RAM device via so-called address input pins. For inputting and outputting the data, a plurality of, e.g. 16, so-called data in-put/out-put pins (I/Os or Inputs/Outputs) are provided. By applying an appropriate signal (e.g. a Read/Write signal) to a write/read selection pin, the user can select whether the data is stored or read.

It is advantageous to accommodate as many memory cells as possible in a RAM device. In the case of so-called SRAMs (SRAM=Static Random Access Memory), the individual memory cells consist of few, for instance 6, transistors, and in the case of so-called DRAMs (DRAM=Dynamic Random Access Memory) the individual memory cells usually consist of a signal, correspondingly controlled capacitor, with the capacitance of which one bit each can be stored as charge. This charge, however, remains for a short time only. Therefore, a so-called "refresh" must be performed regularly, e.g., approximately every 64 ms.

For technological reasons, the individual memory cells in memory devices, in particular DRAM devices, are arranged (e.g., positioned side by side in a plurality of rows and columns) in a rectangular matrix (regularly divided into a plurality of cell fields) or in a rectangular array (regularly divided into a plurality of cell fields).

In order to obtain a correspondingly high total storage capacity, and/or to achieve a data read or write rate as high as possible, instead of one single array, there by be provided a plurality of, e.g. four substantially rectangular, individual arrays in one single RAM device or chip ("multi-bank chip"). The plurality of arrays are called "memory banks".

In order to perform a write or read access, a particular, predetermined sequence of instructions must be performed: For instance, by means of a word line activating instruction (ACT), a corresponding word line, assigned to a particular array (and defined by the row address), is initially activated.

As a result, the data values stored in the memory cells assigned to the corresponding word line are read by the sense amplifiers assigned to the corresponding word line. This is called the "activated state" of the word line.

Subsequently, by means of an appropriate read (RD) or write (WT) instruction, the corresponding data, which is specified by the corresponding column address, are output by the corresponding sense amplifier(s) assigned to the bit line specified by the column address (or vice versa, where the data are read into the corresponding memory cells).

Next, by means of a word line deactivating instruction (e.g., a precharge PRE instruction), the corresponding word line is again deactivated, and the corresponding array is prepared for the next word line activating instruction (ACT).

The above-mentioned sense amplifiers are each arranged in a sense amplifier region positioned between two cell fields, wherein, for reasons of space, each sense amplifier may be assigned to two different cell fields (namely, the two cell fields directly adjacent to the corresponding sense amplifier region). These are called shared sense amplifiers.

Depending on whether data are to be read from the cell field positioned at the left or at the right, next to the respective sense amplifier (or the cell field positioned above or below the respective sense amplifier), the corresponding sense amplifier is connected to the corresponding cell field by appropriate switches. In particular, the corresponding sense amplifier is connected to the corresponding bit line assigned to the respective cell field, or is connected electrically with the corresponding cell field, in particular the corresponding bit line assigned to the respective cell field. The corresponding sense amplifier may alternatively be disconnected from the corresponding cell field (or the corresponding bit line assigned to the respective cell field), or may be disconnected electrically from the corresponding cell field or the corresponding bit line assigned to the respective cell field.

The corresponding switches effecting the connecting or disconnecting, respectively, in particular transistors, are controlled by an appropriate control line (MUX lines, in particular a right MUX line ($MUX_R$ line) and a left MUX line ($MUX_L$ line)) positioned parallel to the word lines at the left or at the right next to the cell fields in the above-mentioned sense amplifier regions (and above or below regions adjacent thereto).

The control signals ($MUX_R$ or $MUX_L$ signal) applied at the MUX lines are driven by a driver device connected with the corresponding MUX line, said driver device being arranged in a region positioned below or above (or at the right or at the left of) all of the cell fields of the corresponding array, e.g., a segment control region positioned at an edge region of the array.

The MUX lines may be relatively long. This results in relatively large signal delays of the control signals (MUX signals) applied at the MUX lines, and to a relatively low switching rate during the connecting and/or disconnecting of the sense amplifiers to or from the corresponding cell field (or the bit line assigned to the corresponding cell field).

SUMMARY OF THE INVENTION

The invention provides a novel sense amplifier connecting/disconnecting circuit arrangement, and a novel method for operating a sense amplifier connecting/disconnecting circuit arrangement.

In one embodiment of the invention, a sense amplifier connecting/disconnecting circuit arrangement, in particular for a semiconductor memory device, is provided, including a switching device for connecting a sense amplifier device to a bit line or to a cell field region, and for disconnecting the sense amplifier device from the bit line or from the cell field region, as a function of the state of a control signal (MUXL, MUXR) applied at a control line, a driver device for driving the control signal (MUXL, MUXR), where an additional device, in particular an additional switch, is provided, by means of which a change of state of the control signal (MUXL, MUXR) applied at the control line can be effected.

The additional device, in particular the additional switch, is positioned, in contrast to the driver device, relatively close to the sense amplifier device.

By providing the switch, the corresponding sense amplifier device can be disconnected from the corresponding cell field region (or the corresponding bit line) relatively quickly.

BRIEF DESCRIPTION OF THE DRAWINGS

In the following, the invention will be explained in detail with respect to exemplary embodiments and the enclosed drawings. In the drawings:

FIG. 5 shows a schematic detail representation of the MUX control line driver devices illustrated in FIG. 4 and FIG. 6.

FIG. 6 shows a circuit arrangement used in accordance with an embodiment of the invention for the quick disconnecting of the MUX control lines illustrated in FIG. 3.

DETAILED DESCRIPTION OF THE INVENTION

Figure 1:
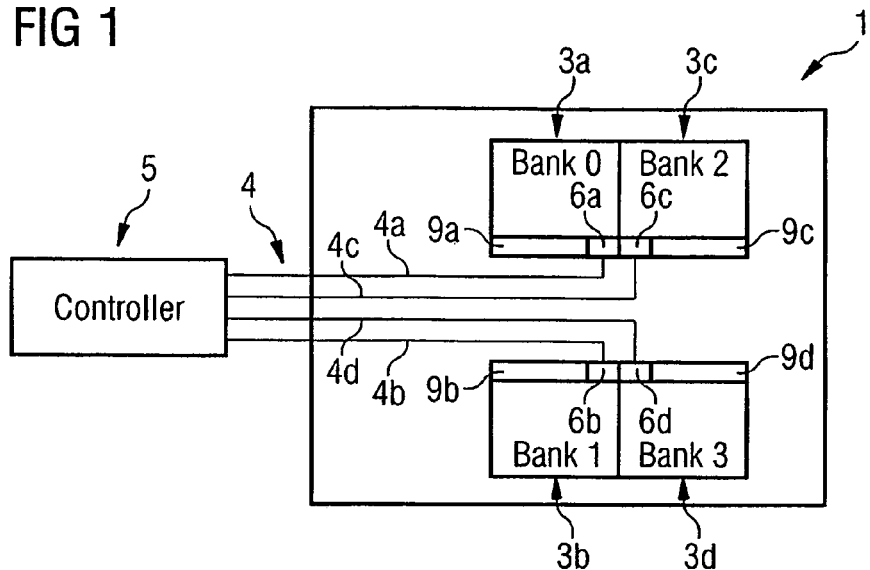
FIG. 1 shows a schematic representation of the construction of a semiconductor memory device with a plurality of arrays, and of a memory controller according to embodiments of the present invention.

FIG. 1 is a schematic representation of the construction of a semiconductor memory device 1 or a semiconductor memory chip, and of a centralmemory controller 5.

The semiconductor memory device 1 may, for instance, be a table memory device based on CMOS technology, e.g. a RAM memory device (RAM=Random Access Memory or write-read memory), in particular a DRAM memory device (DRAM=Dynamic Random Access Memory or dynamic write-read memory).

In the semiconductor memory device 1, after the input of a corresponding address (e.g. by the memory controller 5), data may be stored under the respective address, and may be read again later at this address.

The address may be input in several steps, e.g., two successive steps such as a row address (parts of a column address and/or possibly other address parts), and then the column address (or the remaining parts of the column address and/or the above-mentioned other address parts or the remaining parts thereof).

By applying an appropriate control signal (e.g., a read/write signal) from the memory controller 5, the data can be stored or read.

The data input in the semiconductor memory devices 1 are, as will be explained in more detail below, stored in corresponding memory cells there, and are rear from the corresponding memory cells later.

Every memory cell consists of few elements, in particular only a single, correspondingly controlled capacitor, the capacitance from which one bit can be stored as charge.

As shown in FIG. 1, a particular number of memory cells are arranged in a plurality of rows and columns side by side in a rectangular or square array (known as a memory bank) 3a, 3b, 3c, 3d, so that, for example, every 32 MBit, 64 MBit, 128 MBit, 256 MBit, etc. can be stored in an array 3a, 3b, 3c, 3d, corresponding to the number of memory cells contained.

As is further illustrated in FIG. 1, the semiconductor memory device 1 comprises a plurality of memory cell arrays 3a, 3b, 3c, 3d (the memory banks 0-3), each being of substantially identical construction and being distributed regularly over the area of the device, and being controlled substantially independently of one another by the above-mentioned memory controller 5, so that a total storage capacity of, for example, 128 MBit, 256 Mbit, 512 MBit, 1024 MBit, or 1 GBit results for the semiconductor memory device 1.

By providing a plurality of substantially independent arrays 3a, 3b, 3c, 3d, write or read accesses can be performed in parallel or overlapping in time with a plurality of different arrays 3a, 3b, 3c, 3d.

The above-mentioned address, input in the semiconductor memory device 1 or in the memory controller 5, comprises, as a part of the above-mentioned further address parts, a corresponding number of bits (e.g., array selection bits or bank address bits) serving to address the respectively desired array 3a, 3b, 3c, 3d during the storing or reading of data.

As will be explained in more detail below, the above-mentioned memory cells are arranged in the arrays 3a, 3b, 3c, 3d in corresponding cell fields or cell field regions 7a, 7b, 7c, 7d that are positioned vertically one on top of the other or horizontally side by side (e.g., the cell field regions 7a, 7b, 7c, 7d, illustrated by way of example in FIG. 2, and a plurality of further cell field regions (not shown) positioned at the right or at the left, and above or below the cell field regions 7a, 7b, 7c, 7d in the representation pursuant to FIG. 2).

The cell field regions 7a, 7b, 7c, 7d are of substantially identical construction, substantially of rectangular or square design, and each comprise a particular number of memory cells positioned side by side in a plurality of rows and columns.

Between every two cell fields 7a, 7b, 7c, 7d (or, in the representation pursuant to FIG. 2, at the left or at the right of a cell field 7a, 7b, 7c, 7d) substantially rectangular sense amplifier regions 10a, 10b, 10c, 10d, 10e, 10f, are positioned.

In each of the sense amplifier regions 10a, 10b, 10c, 10d, 10e, 10f, a plurality of sense amplifier 11 are arranged, wherein the corresponding sense amplifiers 11 (or more exactly: the sense amplifiers 11 arranged in the sense amplifier regions 10a, 10b, 10c, 10d, 10e, 10f positioned between every two different cell fields 7a, 7b, 7c, 7d) are each assigned to two different cell fields 7a, 7b, 7c, 7d directly adjacent to the corresponding sense amplifier region.

As shown in FIG. 1, each array comprises a rectangular array controller 6a, 6b, 6c, 6d (bank control) separately assigned to the respective array 3a, 3b, 3c, 3d, said array controller 6a, 6b, 6c, 6d being positioned in an edge region of the respective array 3a, 3b, 3c, 3d.

Figure 2:
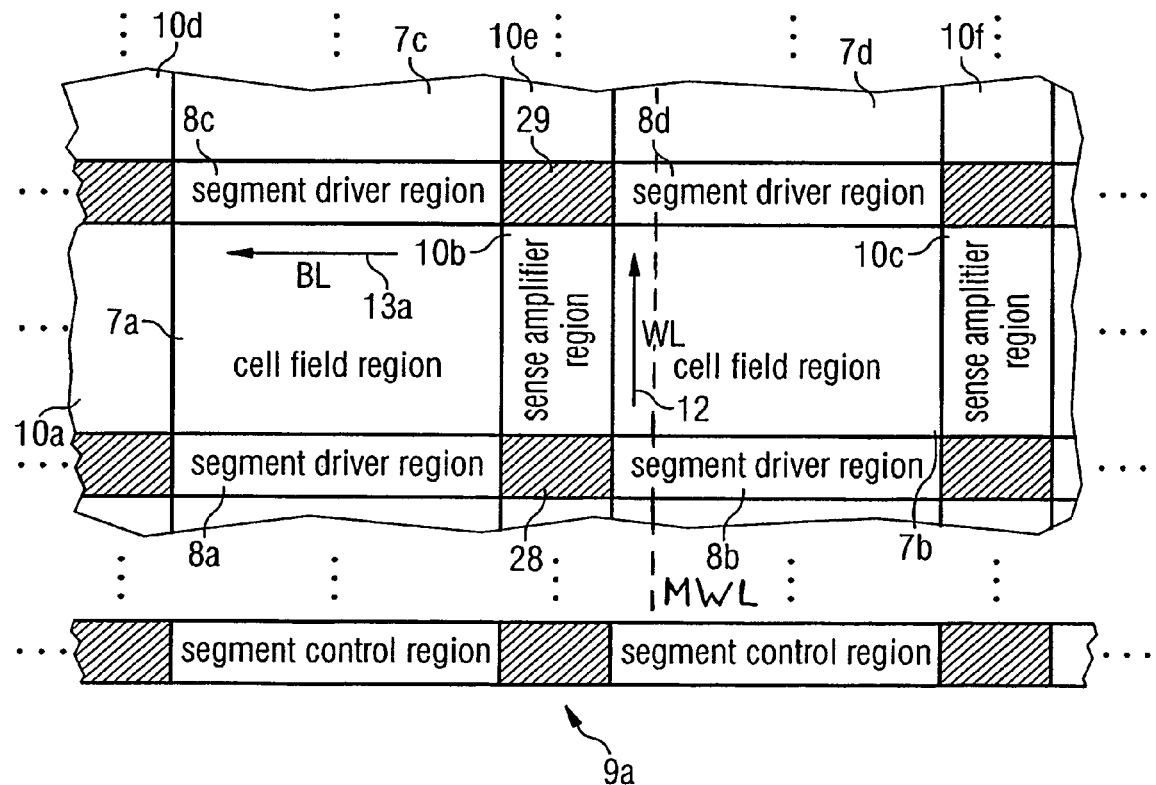
FIG. 2 shows a schematic detail representation of the construction of a section of one of the arrays of the semiconductor memory device illustrated in FIG. 1.

In accordance with FIG. 2, segment or word line driver regions 8a, 8b, 8c, 8d of substantially rectangular design are positioned between every two cell fields 7a, 7b, 7c, 7d (or, as shown in FIG. 2, above or below a cell field 7a, 7b, 7c, 7d).

In each of the segment driver regions 8a, 8b, 8c, 8d, a plurality of corresponding segment or word line driver means are arranged.

As shown in FIG. 1 and FIG. 2, at an edge region of the respective array 3a, 3b, 3c, 3d positioned below or above (or alternatively at the right or at the left) of the corresponding cell fields 7a, 7c or 7b, 7d, there is positioned a segment or word line control region 9a, 9b, 9c, 9d in which as will be explained in more detail below, corresponding MUX control line driver devices 20a, 20b are arranged (see also FIG. 4).

As shown in FIG. 2, within each cell field region 7a, 7b, 7c, 7d there extend, from the segment driver region 8a, 8b, 8c, 8d, assigned to the respective cell field region 7a, 7b, 7c, 7d, a plurality of word lines 12 (in FIG. 2, only one word line WL is illustrated for the sake of clarity). The number of word lines 12 provided per cell field region 7a, 7b, 7c, 7d may, for instance, correspond to the number of memory cell rows in the respective cell field region 7a, 7b, 7c, 7d. For simultaneous reading/storing of several bits, the number of word lines per cell field region may correspond to a fraction of a memory cell row.

The individual word lines 12 are equidistantly arranged parallel to one another (and extend parallel to the outer edge of the respective cell field region 7a, 7b, 7c, 7d).

Figure 3:
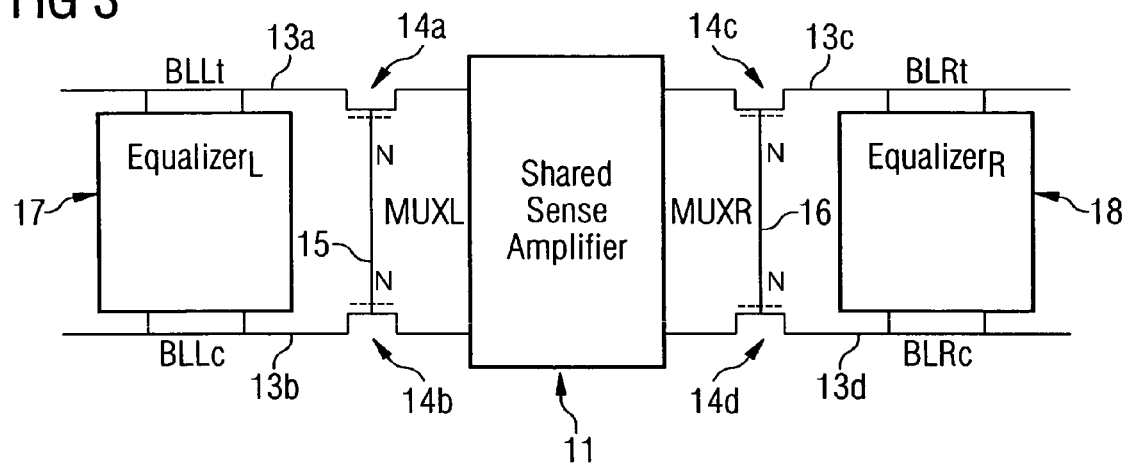
FIG. 3 shows a schematic representation of a shared sense amplifier provided in corresponding sense amplifier regions of the array or array section illustrated in FIGS. 1 and 2.

As shown in FIG. 2 and FIG. 3, bit lines 13a, 13b, 13c, 13d extend within each cell field region 7a, 7b, 7c, 7d, from the sense amplifier regions 10a, 10b, 10c, 10d assigned to the respective cell field region 7a, 7b, 7c, 7d. In FIG. 2 only one bit line BL is illustrated for the sake of clarity. In FIG. 3 bit lines BLLt, BLLc, BLRt and BLRc are illustrated).

The number of bit lines 12 provided per cell field region 7a, 7b, 7c, 7d may correspond to the number of memory cell columns in the respective cell field region 7a, 7b, 7c, 7d, or to a multiple thereof.

The individual bit lines or bit line pairs 13a, 13b or 13c, 13d, are equidistantly arranged parallel to one another, and extend parallel to the outer edge of the respective cell field region 7a, 7b, 7c, 7d, and perpendicular to the above-mentioned word lines 12.

The central memory controller 5 may, as illustrated in FIG. 1, be designed as a separate semiconductor device communicating with the DRAM semiconductor memory device 1 via external pins.

Alternatively, the memory controller 5 may also be arranged on the same chip 1 as the above-mentioned memory cell arrays 3a, 3b, 3c, 3d (memory banks 0-3).

In order to perform a write or read access in the semiconductor memory device 1, a particular, predetermined sequence of instructions must be performed: For instance, by means of a word line activating instruction (ACT), a corresponding word line 12 or row of memory cells assigned to a particular array 3a, 3b, 3c, 3d determined by the above-mentioned address is activated.

This is effected by, as is illustrated in FIG. 1, a corresponding word line activating instruction signal (ACT signal) transmitted from the memory controller 5 via a control line 4a, 4b, 4c, 4d of a control line data bus 4 assigned to: (1) the respective array 3a, 3b, 3c, 3d to be addressed; (2) the array controllers 6a, 6b, 6c, 6d thereof, (3) all arrays 3a, 3b, 3c, 3d; or (4) all array controllers 6a, 6b, 6c, 6d), (and, simultaneously, the above-mentioned address).

As explained above, a plurality of sense amplifiers 11 are arranged in each of the sense amplifier regions 10a, 10b, 10c, 10d, 10e, 10f of the respective array 3a, 3b, 3c, 3d, wherein the corresponding sense amplifiers 11, arranged in the sense amplifier regions 10b, 10c positioned between two different cell field regions 7a, 7b, 7c, 7d, are assigned to two different cell field regions 7a, 7b, 7c, 7d (namely the cell field regions 7 directly adjacent to the corresponding sense amplifier region 10b).

Therefore, it must be ensured (e.g. by the memory controller 5) that word lines 12 are not activated, in parallel or simultaneously, if they are assigned to two different cell field regions 7a, 7b which are adjacent to the same sense amplifier region 10b. Word lines 12 should be activaited in, at most, every second cell field region 7a, 7b positioned side by side at the right or at the left, as shown in FIG. 2. Alternatively, there should be only one word line per array 3a, 3b, 3c, 3d.

Upon receiving the above-mentioned word line activating instruction signal (ACT signal), the respective array controller 6a, 6b, 6c, 6d, provided separately for each array 3a, 3b, 3c, 3d, and receiving the respective ACT signal, causes the data values stored in the respective row (defined by the respective row address) of memory cells arranged in the corresponding cell field region 7a, 7b, 7c, 7d to be read from the sense amplifiers 11 of the respective sense amplifier region 10a, 10b, 10c, 10d, 10e, 10f that are assigned to the corresponding word line 12 ("activated state" of the word line 12).

This word line 12 is kept in the activated state until a further word line, arranged in the same array 3a, 3b, 3c, 3d, is accessed, or until a further word line of a further cell field region 7a, 7b, 7c, 7d is accessed, which is adjacent to the same sense amplifier region 10b, such as the cell field region 7a, 7b, 7c, 7d of the activated word line 12 (or to a further word line, differing from the activate word line 12, in the same cell field region 7a, 7b, 7c, 7d as the activated word line 12).

Using a word line deactivating instruction (e.g., a precharge (PRE) instruction) transmitted via a control line assigned to: (1) the respective array 3a, 3b, 3c, 3d to be addressed; (2) the array controller 6a, 6b, 6c, 6d thereof; (3) the arrays 3a, 3b, 3c, 3d; or (4) the array controllers 6a, 6b, 6c, 6d of the semiconductor memory device 1, the corresponding word line 12 is deactivated, and the corresponding array 3a, 3b, 3c, 3d is prepared for the next word line activating instruction ACT).

As long as the word line 12 is left in the above-mentioned activated state, the memory controller 5 of the semiconductor memory device 1 will not send a corresponding word line deactivating instruction signal (precharge or PRE instruction signal) characterizing the word line 12 to be deactivated with a corresponding address.

After the above-mentioned word line activating (ACT) signal, the memory controller 5 sends, via a control line assigned to: (1) the respective array 3a, 3b, 3c, 3d to be addressed; (2) the array controller 6a, 6b, 6c, 6d thereof; (3) the arrays 3a, 3b, 3c, 3d; or (4) the semiconductor memory device 1, a corresponding read (RD) or write (WT) instruction signal.

Upon receiving the above-mentioned read (RD) or write (WT) instruction signal, the respective array controller 6a, 6b, 6c, 6d, provided separately for each array 3a, 3b, 3c, 3d, and receiving the respective RD (or WT) instruction signal, causes the corresponding data (specified by the corresponding column address) to be output by the sense amplifier(s) 11 assigned to the bit line BL or the bit line pair BLLt, BLLc or BLRt, BLRc, specified by the column address (or the data to be read into the corresponding memory cells).

As explained above, the sense amplifiers 11 are arranged in a sense amplifier region 10 positioned between two cell field regions 7a, 7b, wherein, for reasons of space, the same sense amplifier 11 is assigned to two different cell field regions 7a, 7b (directly adjacent to the corresponding sense amplifier region 10b) (so-called shared sense amplifiers).

Depending on whether, according to FIG. 2 and FIG. 3, data are to be read from the cell field region 7a, 7b positioned at the right or at the left of the respective sense amplifier 11, the corresponding sense amplifier 11 is connected by switches 14a, 14b, 14c, 14d (e.g., transistors 14a, 14b, 14c, 14d positioned in the same sense amplifier region 10b as the assigned sense amplifier 11) to the corresponding cell field region 7a or 7b (in particular to the corresponding bit line (BL) or bit line pair 13a, 13b or 13c, 13d (BLLt, BLLc or BLRt, BLRc) assigned to the respective cell field region 7a or 7b), or is connected by switching on the corresponding switches or transistors 14a, 14b or 14c, 14d, electrically connected with the corresponding cell field region 7a or 7b, in particular the corresponding bit line (BL) or bit line pair 13a, 13b or 13c, 13d (BLLt, BLLc or BLRt, BLRc) positioned in the respective cell field region 7a or 7b). The corresponding sense amplifier 11 is disconnected from the corresponding cell field region 7a or 7b (or the corresponding bit line (BL) or bit line pair 13a, 13b or 13c, 13d (BLLt, BLLc or BLRt, BLRc) assigned to the respective cell field region 7a or 7b), or is, by switching off the corresponding switches or transistors 14a, 14b or 14c, 14d, electrically disconnected from the corresponding cell field region 7a or 7b (or the corresponding bit line (BL) or bit line pair 13a, 13b or 13c, 13d (BLLt, BLLc or BLRt, BLRc) positioned in the respective cell field region 7a or 7b).

To this end, according to FIG. 3, the transistors 14a, 14b are switched on in parallel or simultaneously (and the transistors 14c, 14d are switched off), or the transistors 14c, 14d are switched on in parallel or simultaneously (and the transistors 14a, 14b are switched off).

The corresponding switches, in particular transistors 14a, 14b or 14c, 14d (which are correspondingly switched on or off, as explained above), effecting the connection or disconnection of the cell field regions 7a or 7b or of the bit line/the bit line pair 13a, 13b or 13c, 13d, to or from the corresponding sense amplifier 11, are controlled by a corresponding control line 15, 16.

Whenever a "logically high" MUXL signal for the transistors 14a, 14b, positioned at the left of the sense amplifier 11 in FIG. 3, or a "logically high" MUXR signal for the transistors 14c, 14d, positioned at the right of the sense amplifier 11 in FIG. 3, is applied at the control line 15 or 16 that is connected with a corresponding control input of the transistors 14a, 14b or 14c, 14d, the corresponding transistors 14a, 14b or 14c, 14d, are switched on (i.e. the sense amplifier 11 is electrically connected with the bit line pair 13a, 13b or 13c, 13d, rand, as will be explained in more detail below, with a corresponding equalizer or a corresponding equalizer device 17 or 18.

Whenever a "logically low" MUXL signal for the transistors 14a, 14b, positioned at the left of the sense amplifier 11 in FIG. 3, or a "logically low" MUXR signal for the transistors 14c, 14d, positioned at the right of the sense amplifier 11 in the representation of FIG. 3, is applied at the corresponding control line 15 or 16, the corresponding transistors 14a, 14b or 14c, 14d, are switched off (i.e., the sense amplifier 11 is electrically disconnected from the bit line pair 13a, 13b or 13c, 13d and, as will be explained in more detail below, from the corresponding equalizer or a corresponding equalizer device 17 or 18.

As shown in FIG. 3, control lines 15 of the sense amplifiers 11 of the sense amplifier region 10b, positioned to the left of the corresponding sense amplifiers 11 (or, alternatively, the corresponding "left" control lines of the sense amplifiers of the sense amplifier regions 10e positioned, in FIG. 2, above or below the sense amplifier region 10b) are, pursuant to FIG. 4, connected to a central control line 21 (MUXL line 21), and the control lines 16 of the sense amplifiers 11 of the sense amplifier region 10b, positioned to the right of the corresponding sense amplifiers 11 (or, alternatively, the corresponding "right" control lines of the sense amplifiers of the sense amplifier regions 10e positioned, in FIG. 2, above or below the sense amplifier region 10b) are connected to a further central control line 22 (MUXR line 22).

The MUXL line 21 extends parallel to the word lines 12, and positioned at the left of the corresponding sense amplifiers 11 in FIG. 3, over the entire length of the sense amplifier region 10b assigned to the respective sense amplifiers 11 (and therebeyond, in FIG. 2 and FIG. 4) downwards in the direction of the segment or word line control region 9a, 9b, 9c, 9d in which, as, explained above, corresponding MUX control line driver devices 20a, 20b are arranged. Alternatively, MUXL line 21 extends through further sense amplifier regions 10e positioned above the sense amplifier region 10b and upwards (i.e. over the entire length of corresponding master word lines (MWL) (not shown).

Correspondingly, the MUXR line 22 extends parallel to the word lines 12, and positioned at the right of the corresponding sense amplifiers 11 in FIG. 3, over the entire length of the sense amplifier region 10b assigned to the respective sense amplifier 11 (and therebeyond in FIG. 2 and FIG. 4) downwards in the direction of the segment or word line control region 9a, 9b, 9c, 9d, in which, as, explained above, corresponding MUX control line driver devices 20a, 20b are arranged. Alternatively, the MUXR line 22 extends through further sense amplifier regions 10e positioned above the sense amplifier region 10b and upwards (i.e. over the entire length of corresponding master word lines (MWL) (not shown).

The MUXL line 21 is connected to the (central) MUX control line driver device 20a, and the MUXR line 22 is connected to the (central) MUX control line driver device 20b.

As is illustrated in FIG. 5, each MUX control line driver device 20a, 20b comprises three transistors 24a, 24b, 24c adapted to be controlled separately by corresponding signals at corresponding transistor control lines 23a, 23b, 23c (e.g., an n-channel MOSFET 24c, and, connected in series thereto, two p-channel MOSFETS 24a, 24b, connected in parallel).

The n-channel MOSFET 24c is connected with the mass potential via a line 25a, with the corresponding MUXL or MUXR line 21 or 22 via a line 25b, and with the p-channel MOSFET 24a and the p-channel MOSFET 24b via lines 25c or 25d.

The p-channel MOSFET 24b is connected via a line 25e to a (first) supply voltage, having a first voltage level. The p-channel MOSFET 24a is connected via a line 25f to a (second) supply voltage, having a second voltage level differing from the first voltage level.

If, via a corresponding signal applied at the transistor control line 23c, the n-channel MOSFET 24c is placed in a conductive state, and, via corresponding signals applied at the transistor control lines 23a, 23b, the p-channel MOSFETs 24a, 24b are placed in a locked state, a "logically low" MUXL or MUXR signal is output at the corresponding MUXL or MUXR line 21 or 22 (and thus also at the control lines 15 or 16 connected thereto and shown in FIG. 3).

Accordingly, if, via a corresponding signal applied at the transistor control line 23c, the n-channel MOSFET 24c is placed in a locked state, and, ia corresponding signals applied at the transistor control lines 23a, 23b, the p-channel MOSFET 24b is placed in a conductive state and the p-channel MOSFET 24a is placed in a locked state, a "logically high" MUXL or MUXR signal, having the above-mentioned first voltage level, is output at the corresponding MUXL or MUXR line 21 or 22 (and thus also at the control lines 15 or 16 connected thereto and shown in FIG. 3).

Correspondingly, if, via a corresponding signal applied at the transistor control line 23c, the n-channel MOSFET 24c is placed in a locked state, and, via corresponding signals applied at the transistor control lines 23a, 23b, the p-channel MOSFET 24a is placed in a conductive state and the p-channel MOSFET 24b is placed in a locked state, a "logically high" MUXL or MUXR signal, having the second voltage level differing from the first voltage level, is output at the corresponding MUXL or MUXR line 21 or 22 (and thus also at the control lines 15 or 16 connected thereto and shown in FIG. 3).

Figure 4:
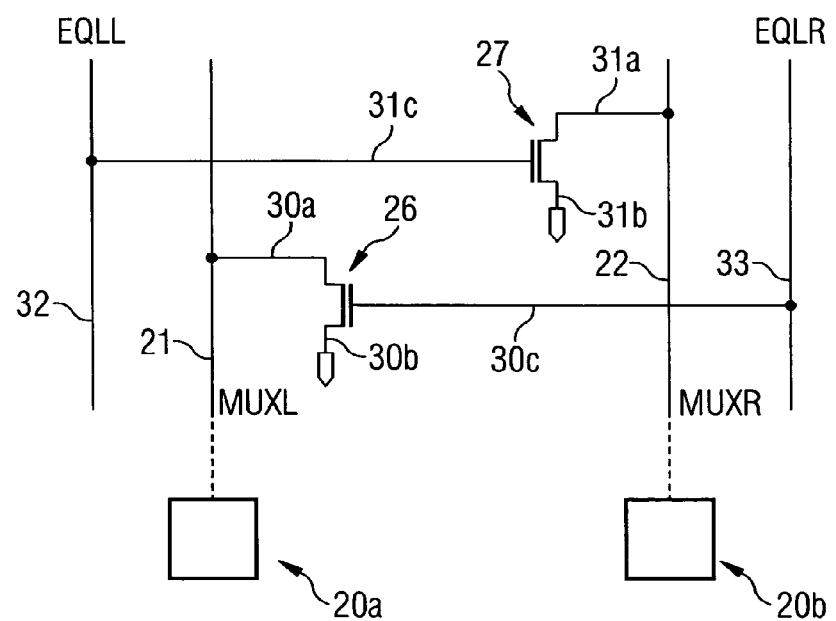
FIG. 4 shows a circuit arrangement used in accordance with an embodiment of the invention for the quick disconnecting of the MUX control lines illustrated in FIG. 3.

In order to be able to quickly change the MUXL or MUXR signal from a "logically high" to a "logically low" state, there are provided, as illustrated in FIG. 4, except from the central n-channel MOSFET 24c that will then have to be placed in a conductive state and that is provided in the MUX control line driver device 20a or 20b, one or more additional switches positioned locally adjacent to the respective sense amplifiers 11 or the corresponding sense amplifier regions 10b, 10e, in particular transistors 26, 27 (e.g., corresponding n-channel MOSFETS 26, 27).

The transistors 26, 27 may, as is illustrated in FIG. 2, be arranged in an intersection region 28 between the respective sense amplifier region 10b assigned to the respective sense amplifiers 11 and the segment driver regions 8a, 8b assigned thereto, below the corresponding sense amplifiers 11 e.g. illustrated in FIG. 3. The transistors 26, 27 may alternatively be arranged in an intersection region 29, positioned in FIG. 2 above the corresponding sense amplifier region 10b, or within the corresponding sense amplifier region 10b, etc.

For each MUXL or MUXR line 21, 22, respectively, there may, as is illustrated in FIG. 4, be a local transistor 26 or 27 or, alternatively, a plurality of transistors connected similar to the transistors 26 or 27. The transistors are, e.g., positioned in one single intersection region 28 or sense amplifier region 10b, or are distributed in a plurality of intersection regions 28, 29 or sense amplifier regions 10b, 10c through which lines 21, 22 pass. In each intersection region 28, 29 or sense amplifier region 10b, 10c, for each of the lines 21, 22, one or more transistors similar to the transistors 26, 27 illustrated in FIG. 4, may be provided.

As shown in FIG. 4, the transistor 26, which is adapted to draw the MUXL line 21 locally downwards or to a logically low state, and possibly the above-mentioned additional transistors adapted to draw the MUXL line 21 locally downwards or to a logically low state, is, via line 30a, connected to the MUXL line 21, and, via line 30b to the mass potential.

Similarly, the transistor 27, which is adapted to draw the MUXR line 22 locally downwards or to a logically low state, and possibly the above-mentioned additional transistors adapted to draw the MUXR line 22 downwards or to a logically low state, via line 31a, connected to the MUXR line 22, and via line 31b to the mass potential.

The transistors 26, 27 (and further transistors) are adapted to draw the MUXL or MUXR line 21, 22, respectively, perhaps together with the corresponding MUX control line driver devices 20a, 20b, locally downwards or to a logically low state, by placing the transistors 26, 27 in a conductive state, i.e. switched on.

To this end, a logically high control signal is applied to a control line input, connected with a corresponding transistor control line 30c or 31c, of the corresponding transistor 26 or 27.

This renders it possible to quickly draw the MUXL or the MUXR signal downwards or to a logically low state, without complete intermediate amplifiers having to be provided in the respective intersection regions 28 (or sense amplifier regions 10b). The intermediate amplifiers, other than the transistors 26, 27, having to be connected, except with the mass potential, via one or a plurality of further transistors, with the above-mentioned first supply voltage having a first voltage level, and possibly additionally with the above-mentioned second supply voltage having a second, differing voltage level).

Advantageously, the same signals can be used as control signals for the transistors 26, 27, and as control signals for the equalizer devices 17, 18 illustrated in FIG. 3.

In particular, for controlling the transistors 27 drawing the MUXR line 22, downwards or to a logically low state, an EQLL signal can be applied at a control line 32, positioned to the left of the corresponding sense amplifiers 11. The EQLL signal is used to control the equalizer devices 17 positioned to the left of the corresponding sense amplifiers 11 and opposite to the MUXR line 22 that is, in the representation of FIGS. 3 and 4, positioned to the right of the corresponding sense amplifiers 11.

Correspondingly, for controlling the transistor 26 drawing the MUXL line 21 downwards or to a logically low state, an EQLR signal can be applied at a control line 33, positioned to the right of the corresponding sense amplifiers 11. The EQLR signal is used to control the equalizer devices 18 positioned to the right of the corresponding sense amplifiers 11 and opposite to the MUXL line 21 that is, in the representation of FIGS. 3 and 4, positioned to the left of the corresponding sense amplifiers 11.

Using equalizer devices 17, 18, depending on the state of the EQLL or EQLR signal applied at the control lines 32 or 33, respectively, either i) the sense amplifier 11 assigned to the respective equalizer device 17, 18 is kept in a "precharge state" (wherein the corresponding cell field region 7a, 7b cannot be activated), or ii) the sense amplifier 11 assigned to the respective equalizer device 17, 18 is released again from the "precharge state" (so that the corresponding cell field region 7a, 7b may then be activated).

In an alternative embodiment illustrated in FIG. 6, transistors 26a, 27a, 26b, 27b, 26c, 27c, corresponding to the transistors 26, 27 illustrated in FIG. 4, may also be controlled by a control signal CON or /CON, being generated separately or individually for controlling the transistors 26a, 27a, 26b, 27b, 26c, 27c, being inverted by an inverter 34, and being supplied to the control connections of the transistors 26a, 27a, 26b, 27b, 26c, 27c via transistor control lines 35 corresponding to the transistor control lines 30c, 31c.

In the embodiment shown in FIG. 6, a local driver such as MUX control line driver 20a/20b is provided at the beginning of the word line. Also as shown, the embodiment of FIG. 6 includes an additional switch such as transistor 26a/27a to very quickly draw the MUXL or MUXR line 21, 22, respectively downwards. In addition, further switches such as transistors 26b, 27b, 26c, 27c, etc. are provided according, to the above-mentioned first embodiment shown in FIG. 2 in the intersection regions 28 between corresponding segment driver regions 8a, 8b and corresponding sense amplifier regions 10b, at multiple locations along the word line so that the MUXL or MUXR line 21, 22 can be drawn downwards quickly.

The unlabeled resistors and capacitors of FIG. 6 are symbolic of the circuitry of each segment driver regions 8a, 8b, etc. where stored energy must be drawn down or dissipated to switch the control line from a logical high to a logical low.

What is claimed is:

1. A sense amplifier connecting/disconnecting circuit arrangement for a semiconductor memory device, comprising:
    switching devices for connecting or disconnecting a sense amplifier device allocated to several different cell field regions to or from a bit line of a first cell field region, and for connecting or disconnecting the sense amplifier device to or from a bit line of a second cell field region, as a function of a state of control signals applied at respective first and second control lines;
    driver devices for driving the control signals; and
    a first transistor for changing the state of the control signal applied at the first control line, and a second transistor for changing the state of the control signal applied at the second control line, a first connection of the first transistor being directly connected with the first control line, and a second connection of the first transistor being directly connected with a ground potential, a first connection of the second transistor being directly connected with the second control line, and a second connection of the second transistor being connected with the ground potential, wherein
    the first transistor is controlled by a first additional control signal, and the second transistor is controlled by a second additional control signal, and
    the first additional control signal additionally controls a switching device of an equalizer circuit of the second cell field region, and the second additional control signal additionally controls a switching device of an equalizer circuit of the first cell field region.

2. The sense amplifier connecting/disconnecting circuit arrangement according to claim 1, wherein one of the first and second transistors are positioned substantially close to a sense amplifier device region, or in a region adjacent thereto.

3. The sense amplifier connecting/disconnecting circuit arrangement according to claim 2, wherein the region adjacent to the sense amplifier region is an intersection region between the sense amplifier region and a segment driver region.

4. The sense amplifier connecting/disconnecting circuit arrangement according to claim 1, wherein at least one of the driver devices is positioned substantially remote from the sense amplifier device compared to at least one of the first and second transistors.

5. The sense amplifier connecting/disconnecting circuit arrangement according to claim 1, wherein at least one of the driver devices is positioned in an edge region of a memory cell array in which the sense amplifier device is positioned, or outside of the memory cell array.

6. The sense amplifier connecting/disconnecting circuit arrangement according to claim 1, wherein each transistor is connected between the control line and the ground potential.

7. The sense amplifier connecting/disconnecting circuit arrangement according to claim 1, wherein at least one of the first and second transistors changes the state of the control line from logically high to logically low, but cannot change the sate of the control line from logically low to logically high.

8. The sense amplifier connecting/disconnecting circuit arrangement according to claim 1, wherein signals used in the equalizer circuit connected with the sense amplifier device are used as control signals for at least one of the first and second transistors.

* * * * *

UNITED STATES PATENT AND TRADEMARK OFFICE
CERTIFICATE OF CORRECTION

PATENT NO. : 7,336,552 B2 Page 1 of 1
APPLICATION NO. : 10/927497
DATED : February 26, 2008
INVENTOR(S) : Brox et al.

It is certified that error appears in the above-identified patent and that said Letters Patent is hereby corrected as shown below:

In Col. 1, line 42, delete "signal" and insert --single--.
In Col. 3, line 64, delete "devices" and insert --device--.
In Col. 3, line 66, delete "rear" and insert --read--.
In Col. 5, line 33, delete "illustrated)" and insert --illustrated--.
In Col. 6, line 11, delete "activaited" and insert --activated--.
In Col. 6, line 44, delete "ACT)" and insert --ACT--.
In Col. 7, line 52, delete "(i.e." and insert --i.e.--.
In Col. 8, line 32, delete "amplifier" and insert --amplifiers--.
In Col. 9, line 5, delete "ia" and insert --via--.
In Col. 10, line 21, delete "level)" and insert --level--.

Signed and Sealed this

Seventeenth Day of June, 2008

JON W. DUDAS
*Director of the United States Patent and Trademark Office*